United States Patent
Skierszkan et al.

(10) Patent No.: US 7,006,590 B2
(45) Date of Patent: Feb. 28, 2006

(54) TIMING CIRCUIT WITH DUAL PHASE LOCKED LOOPS

(75) Inventors: Simon Skierszkan, Kanata (CA); Robert van der Valk, Rotterdam (NL)

(73) Assignee: Zarlink Semiconductor Inc., Kanata (CA)

( * ) Notice: Subject to any disclaimer, the term of this patent is extended or adjusted under 35 U.S.C. 154(b) by 756 days.

(21) Appl. No.: 09/865,504

(22) Filed: May 29, 2001

(65) Prior Publication Data

US 2002/0001359 A1 Jan. 3, 2002

(30) Foreign Application Priority Data

Jun. 8, 2000 (GB) .................................. 0013862

(51) Int. Cl.
*H03D 3/24* (2006.01)
*H04B 1/38* (2006.01)
*H04L 25/00* (2006.01)

(52) U.S. Cl. .................... 375/376; 375/219; 375/371
(58) Field of Classification Search ................ 375/376, 375/219; 327/148, 157
See application file for complete search history.

(56) References Cited

U.S. PATENT DOCUMENTS

| | | | | |
|---|---|---|---|---|
| 3,626,426 A | * | 12/1971 | Steinberg ................. 340/825.7 |
| 4,388,597 A | * | 6/1983 | Bickley et al. ................. 331/2 |
| 4,633,193 A | | 12/1986 | Scordo | |
| 4,806,879 A | * | 2/1989 | Troxel ............................ 331/2 |
| 5,317,284 A | * | 5/1994 | Yang ............................... 331/2 |
| 5,329,251 A | * | 7/1994 | Llewellyn ........................ 331/2 |
| 5,463,351 A | * | 10/1995 | Marko et al. ............... 331/1 A |
| 5,566,204 A | * | 10/1996 | Kardontchik et al. ....... 375/219 |
| 5,757,239 A | * | 5/1998 | Gilmore ...................... 331/18 |
| 2001/0017557 A1 | | 8/2001 | Friedrich et al. | |

FOREIGN PATENT DOCUMENTS

| | | | |
|---|---|---|---|
| DE | 2084415 | * | 4/1982 |
| DE | 4421 415 | | 8/1994 |
| FR | 2 818 052 A1 | | 6/2002 |
| JP | 02054993 | | 8/1990 |
| JP | 09-298461 A | | 11/1997 |
| WO | 00/14873 | | 3/2000 |
| WO | WO 00/18008 | | 3/2000 |

* cited by examiner

*Primary Examiner*—Stephen Chin
*Assistant Examiner*—Cicely Ware
(74) *Attorney, Agent, or Firm*—Marks & Clerk; Richard J. Mitchell

(57) ABSTRACT

A timing circuit for generating clock signals, includes an acquisition digital phase locked loop with a wide capture range for closely following an input signal with its associated disturbances. An output digital phase locked loop having a slow response relative to the acquisition phase locked loop tracks an output of the acquisition phase locked loop to generate an output signal for the timing circuit.

12 Claims, 4 Drawing Sheets

TIMING CIRCUIT WITH DUAL PHASE LOCKED LOOPS

BACKGROUND OF THE INVENTION

1. Field of the Invention

This invention relates to the field of digital electronics, and in particular to a timing circuit for generating clock signals from a reference signal, particularly for use in digital networks.

2. Description of Related Art

Timing circuits are used for a numerous clocking applications, particularly in digital communications networks. A typical timing circuit comprises a phase locked loop, particularly a digital phase locked loop in which the output of a digital controlled oscillator, divided by a number n, is fed back to a digital phase detector and compared with the input signal. The output of the phase detector is fed to the input of the digital controlled oscillator through a digital filter.

In typical PLL architectures the output of the PLL is never precisely identical to its input. If the input is steady the output may closely follow the input, but will have a slightly different behavior due to noise. In case the input is not steady, the PLL will try to follow the noise, but necessarily with a relatively late response. In PLL's there is typically no basis on which the future value of the input signal can be predicted. Consequently non-causal filtering is required to accurately track the input signal, which clearly is impossible. If accurate analog delay means were feasible it might be possible to precisely mimic the delayed input. However, this type of behavior only exists for signal restoration, where the input signal has information, for example, concerning the phase or frequency domain. This may be the case for receivers, where the PLL forms a convoluter that establishes highest accuracy when the signal is most accurately followed.

In a large class of applications of PLL's, it is actually not desirable for the PLL to precisely follow the input signal. Instead the function of the PLL may be to follow the course behavior of the input signal, but at the same time lose certain aspects of the input signal. A typical example would be a PLL that has a low frequency pass characteristic, which allows for rejection of error components with a relatively high frequency. Another would be a PLL with a band suppression characteristic, which can be used to suppress a known and well quantifiable error such as 50 or 60 Hz spurious. These types of PLL all have the property that they intentionally lose information, and that the input signal and output signal are not identical, and probably not even nearly identical.

PLL's can also be categorized in a number of characteristics in their implementation. Two aspects that can be used, amongst others, are related to the input processing performed in the phase detector. The input may or may not use amplitude, time quantization or both on the input signal. Thus four classes of implementation arise, of which only one is truly digital; the implementation with time and amplitude quantization.

A conventional radio receiver utilizes no quantization in either time or amplitude in its first stages. The existence of many large disturbances will make amplitude quantization difficult due to the number of required bits; time quantization would lose details on for instance phase information. Instead the use of downconversion and sharp filtering on the generated IF frequency yields the effect of losing undesirable signals. The crucial element in this is that effectively the mixing element (which may be called phase detector) forms a simple convoluter to emphasize the desired signal.

Most phase detectors operate on amplitude discrete, time-continuous basis. The output of the phase detector behaves as an analog signal when looked at over some longer period. With a low pass filter the phase detector becomes truly analog. This is due to the time continuous inputs of the detector, and this translates into amplitude continuity on the output.

There are phase detectors, for instance for very high frequency radars, that operate on the basis of sampling the high frequency signal. By sampling over an extremely short period of time (sampling period of 5 ps is possible) the amplitude of the feedback signal or the reference signal is sampled. This avoids the necessity of dividers, and works well for the high frequencies where typically the generated signals more look like sinusoids than squares, which is essential for the linearity of the phase detector. The amplitude continuity here directly leads to phase detector output continuity.

In a truly digital phase detector it therefore will be clear that both the time and the amplitude aspect are discrete. This makes it possible to avoid analog elements, such as in the low pass filter, that inherently introduce all kinds of undesirable inaccuracies. A time discrete signal can be expressed accurately in a number of steps of error, which is the most important property. Fine amplitude quantization (small error) is not so extremely important, but it is essential to have at least information of two levels, so that it becomes relatively trivial to make the PLL go faster or slower. A finer time quantization makes the error in the quantization smaller, a finer amplitude quantization may help in more precisely establishing zero crossings by extrapolation, which also yields smaller time errors. Both error mechanisms can be expressed in equivalent phase error.

Now to implement a very accurate PLL as for instance used for 2.048 MHz signals, which are used in an ST-bus, it is desirable to have the error signal quantized as soon and accurately as possible. The reason for this stems from related accuracies and operations.

A telecomm PLL must have a stable and accurate low pass frequency. The margins that are allowable within the various standards are not extremely large, and become very small if one wants to fulfill several standards or variations within one device. Analog implementations typically suffer from production spread, which for instance within chips can run up to about 50% inaccuracy. A 100% integrated approach is much more robust when made in digital fashion.

An operation such as HOLDOVER (keep on generating some frequency even when the reference does not exist anymore) is a typical non-linear operation which requires memory. This can be implemented in analog fashion, but it is extremely difficult to achieve accuracies of for instance 1E-10. A normal analog implementation typically will already make a jump in either change, current or voltage of for instance 100 ppm. This would imply that the sensitivity of the VCO must be extremely low, which in turn heavily reduces the maximum frequency range, and necessitates a high initial VCO accuracy. To reduce for instance the inaccuracy of the jump relatively complex techniques must be used, such as digital-to-analog converters with many bits and quite possibly trimming. A fully digital implementation can switch virtually error free.

An operation such as switching between two references which are not necessarily in phase performed in analog systems, but requires a measurement/activation cycle, typically using analog-to-digital and digital-to-analog converters. On switching to the new reference any phase offset is handled so that the output phase appears to remain constant. In Analog solutions the realization of the offset is typically done by subtracting the offset at the output of the phase detector with a digital-to-analog convener. In a digital solution this operation is much simpler.

Flexibility is much greater in the digital domain. Non-linear operations such as changing the low pass frequency are quite straightforward to implement. In the analog domain these operations yield extra demands, which have a direct impact on accuracies.

The digital domain can be setup such that the accuracies come directly from the system frequency. If made with a crystal the accuracy is high due to the natural properties of the crystal, especially its high quality. An analog implementation can only use a high quality oscillator by utilizing a VCXO (Voltage Controlled Xtal oscillator), which directly limits its frequency range.

Digital implementations have no particular difficulty in combining high accuracies with large dynamic ranges. To continue with the analog example; a 20-bit accurate DAC still requires a VCO range of only 100 ppm to yield a HOLDOVER accuracy of 1E-10. A digital solution can easily supply a 25% or even 100% range with such a HOLDOVER.

In an all digital implementation the error signals will all be in digital format. This makes the use of these values in statistical measurements (average, min, max, mean, deviation etc) relatively trivial. In an analog solution the signals must be converted to digital first, or be handled with very difficult analog circuits. One of the difficult elements in the analog domain is that the signals may have a wildly varying dynamical range from signal to signal, which does not make the implementation simpler.

In short, an all digital implementation has many advantages. The accuracies that typically are required in telecomm standards almost force the use of digital approaches, especially when a completely integrated approach is desired. The flexibility of an all digital approach is then an extra that can be utilized to expand functionalities.

The functional block diagram of a digital solution is in fact hardly different from the normal analog case; only the blocks are implemented in a digital fashion, with multibit connections instead of analog signals in between. That makes the modeling of an analog PLL almost 100% applicable, which is a well known area from many publications.

An all digital P1 has one major drawback. The feedback signal and the reference typically will not be in Phase because the PLL suppresses certain signal artifacts. This lack of phase alignment directly translates to timing errors. The implicit sampling is discrete and therefore has rounding/trunking errors. This in itself may not seem too serious at a first glance, but it has a direct impact on the transfer function of the PLL, which is related to the transfer function of the phase detector.

An object of the invention is to alleviate the above noted problems present in the prior art.

SUMMARY OF THE INVENTION

According to the present invention there is provided a timing circuit for generating clock signals, comprising an acquisition digital phase locked loop with a wide capture range for closely following an input signal and with its associated disturbances; and an output digital phase locked loop having a slow response relative to said acquisition phase locked loop, said output digital phase locked loop tracking a digital output of said acquisition phase locked loop to generate an output signal for the timing circuit.

The use of a two step approach is elegant. The first digital PLL actively follows all the input signals before all other processing. This means that this first digital PLL has a wide capture range, a high low pass frequency, and a relatively large phase range. Thus the acquisition PLL follows everything of interest. The lo critical element in this PLL must be that its pass frequency must be so high that all relevant error signals are followed. In reality this means that it may have a bandwidth of for instance 100 kHz, since the largest errors will definitely be more towards DC. This is related to the 1/f and $1/f^2$ effects related to VCO's, amplifiers and such. Above these bandwidths the PLL will miss some true noise elements, but such noise tends to be white and not very relevant for telecomm systems.

The first PLL generates a digital output, which is then fed to a second all digital PLL that closely tracks the signal while eliminating the error components. The advantages of an all digital PLL are attained, but since the reference signal for the second PLL is all digital, and no analog-to-digital conversion is required, quantization errors are avoided.

The invention also provides a method of generating clock signals from an input signal subject to errors, comprising tracking the input signal and its error components with an acquisition digital phase locked loop to produce a digital output signal, and tracking said digital output signal with an output digital phase locked loop with a slow response relative to said acquisition digital phase locked loop so as to eliminate said error components

BRIEF DESCRIPTION OF THE DRAWING

The invention will be described in more detail, by way of example only, with reference to the accompanying drawings, in which.

DETAILED DESCRIPTION OF THE PREFERRED EMBODIMENTS

Figure 1:
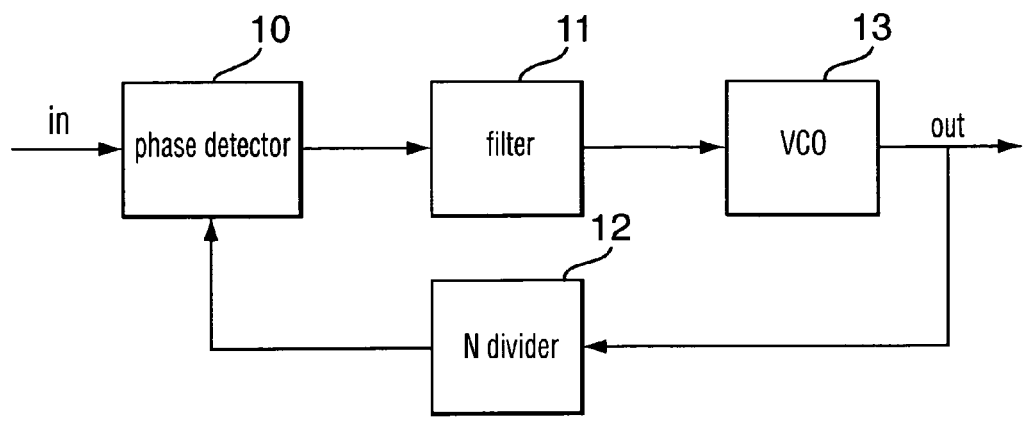
FIG. 1 is a functional block diagram of a digital controlled oscillator.
Figure 2:
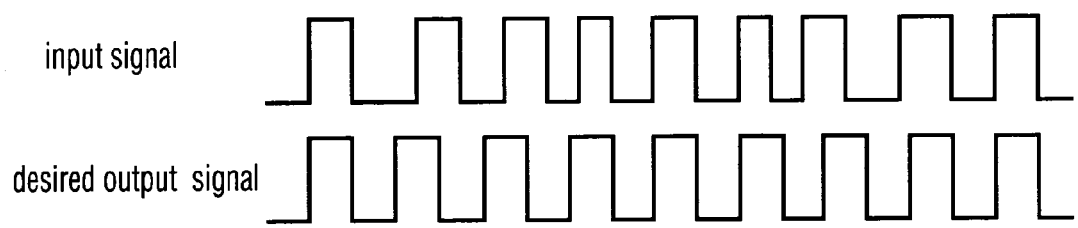
FIG. 2 is a timing chart showing the effect of rejecting error components with high frequency.

Referring firstly to FIG. 1, it will be noted that the mark/space ration of the input signal varies due to spurious error components. An ideal PLL with a low pass frequency characteristic rejects the error components and generates the uniform desired output signal illustrated.

FIG. 1 is a block diagram of a typical all digital phase locked loop. This comprises a digital phase detector 10, which receives a reference signal at its first input, and a digital filter 11 that feeds the output of the phase detector to a digital controlled oscillator 13 (DCO), which in turn generates the output signal. Divider 12 is included in the feedback loop from the output of the DCO 13 to the second input of the phase detector 10. This is similar to an analog phase locked loop except that the DCO replaces the voltage controlled oscillator (VCO) of the analog PLL and the remaining circuits are all digital.

As noted above, this circuit has many advantages over competing designs, but has a number of problems due to the lack of phase alignment of the feedback signal with the reference signal.

Figure 3:
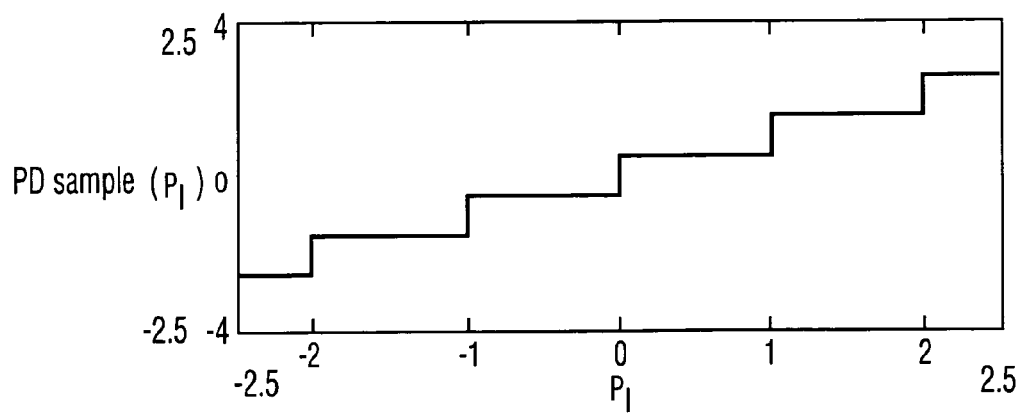
FIG. 3 shows the transfer function of the phase detector of an all digital PLL.

Whereas a normal phase detector has a transfer function that is a straight sloping line, a fully digital sampled phase detector has quantization steps in it as shown in FIG. 3. This could be avoided by not using amplitude quantization, not using time quantization, or neither. In that case the input signal can be restructured perfectly. However, the double quantization makes the illustrated transfer function unavoidable.

The actual values on the axes are not really of importance, but just act to give some feeling about the whole approach. The values are used as in a normal digital counting system.

The horizontal axis can be seen as places where the time sampling happens; some central time t=0, but also t=−1, t=+1 etc. The use of the central 0 is related to the phase relationship of the two signals at the input of the phase detector, which is time invariant, so that it is desirable to use 0 as the central value.

The vertical transition through the 0 is chosen there on purpose. It is possible to shift the whole curve up or down by attaching a value to the sampled signal. In the case of a normal digital signal one could say that the samples are 0 or 1. However, the coding of this signal may be used as to mean −½ and +½ (or, if one would like −⅓, +⅔ etc., but the −½, +½ choice is the most desirable).

Thus the loop gain is maximal around 0. From the theory of analog PLLs it has been known for quite some time that this is quite essential; if one must choose between a horizontal line through 0 the effect would be that a dead zone results, where the feedback may drift back and forth without any effect on the value generated by the phase detector. Instead a steep or even vertical part of the curve through the 0 results in the PLL actively seeking the central position. In analog systems this is also quite important; the phase detector output above the 0 and the part below the zero are typically generated with different current sources, and this in turn yields timing problems. By introducing some overlap from where the 'positive current' ends and the 'negative current' starts the transition through 0 effectively becomes relatively steep.

The biggest impact that the transfer function has is that the gain of the phase detector is normally defined as the slope of the phase transfer curve. This becomes infinite around 0. This can construed as a dependency of the gain on the size of the input error signal; a small error will appear as a much bigger error. In the situation of a digital input signal this is clear; if the reference shifts for instance 0.1 radians from the left side of the 0 to the right side of the 0, the sample will go from 0 to 1, which means a change of 2π radians, so that the gain looks to be 20π instead of 1. This effect is shown in FIG. 4.

Figure 4:
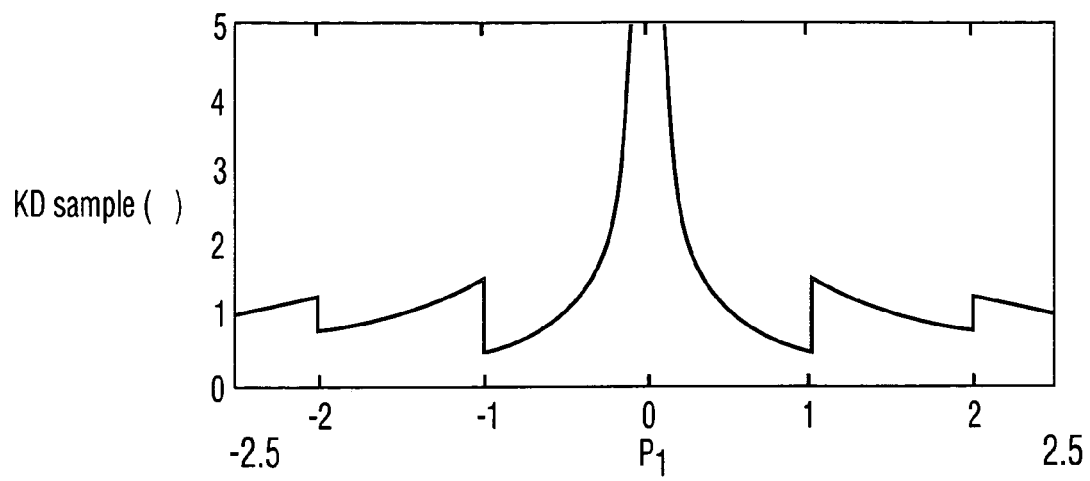
FIG. 4 shows the variation in gain of the phase detector.

It will be seem in FIG. 4 that the gain for large error signals is 1 and the gain around zero is very large. The gain may drop below 1, for instance between 0.5 and 1, where output is always 0.5.

If the time quantization becomes smaller, the error behaviour (discrepancy between actual gain and desired 1) for a certain size of error signal becomes smaller.

Figure 5:
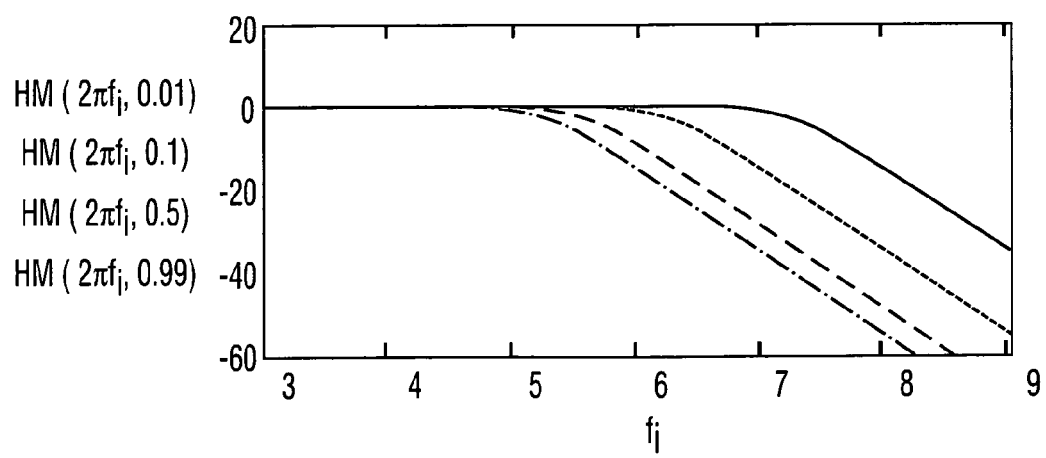
FIG. 5 shows the effect of variation in gain on the transfer function of the phase locked loop.

The major consequence of the variation of the gain can be found in the transfer function of the total system as shown in FIG. 5. A larger gain on the input will mean that the low pass frequency of the total PLL shifts upwards. In fact it can be proven that the system must become unstable at the slightest presence of any delaying or phase shifting element. In fact this is true; the behaviour around 0 will make the system to keep on looking for equilibrium around 0 by going back and forth all the time. This effect is known as a limit cycle. The size of this effect depends on the other elements, such as the sensitivity of the DCO/VCO (Digitally or Voltage Controlled Oscillator), the filters etc. In FIG. 5 the effect is calculated and plotted for some realistic first order transfer curve.

The unstable low pass frequency is undesirable; it means that the system will effectively have a different pass frequency for a small signal than for a large signal. This in general is undesirable, if only because of a large part of the accuracy found in the digital approach is lost.

There are a number of additional problems that arise. Next to the low pass frequency problem elements like peaking and peaking frequency start to shift.

The actual transfer behaviour in time will encounter jumps in the sensitivities while the PLL tries to lock. This in general can be modelled as non-linear behaviour, which can (and probably will) lead to mathematically chaotic behavior. In the large signal model this does not play a large role, but it cannot be fully neglected. Even in the large signal approach some small jumps remain present.

The chaotic behavior leads to relatively strange anomalies such as a difference in behavior of two digital PLLs running on the same clock, with the same starting conditions (reset) and the same input reference; although the PLLs are digital, in fact the outputs will not follow each other accurately. This is due to minor time effects in the PLLs that make the PLLs not really identical after all. The chaotic element magnifies these differences so that the outputs have large differences (this has been verified in real life). In a system with for instance sixteen boards, each having their own PLL that generates some clock from a shared backplane signal, the sixteen generated clocks thus cannot be trusted to be equal or near equal.

It may be impossible to detect any difference between very small, small, and normal error signals if they all fall in the region around the 0. This in turn makes it impossible to give any detail about the input signal by just looking at the output of the phase detector. It is precisely the details that are interesting if one would like to characterize for instance the noise behaviour of a telecomm line. The details may reveal effects such as noise typically from amplifiers, switches etc. These noise sources always will be small (otherwise the remaining information over the line is zero) and thus require a fine resolution for study.

Figure 6:
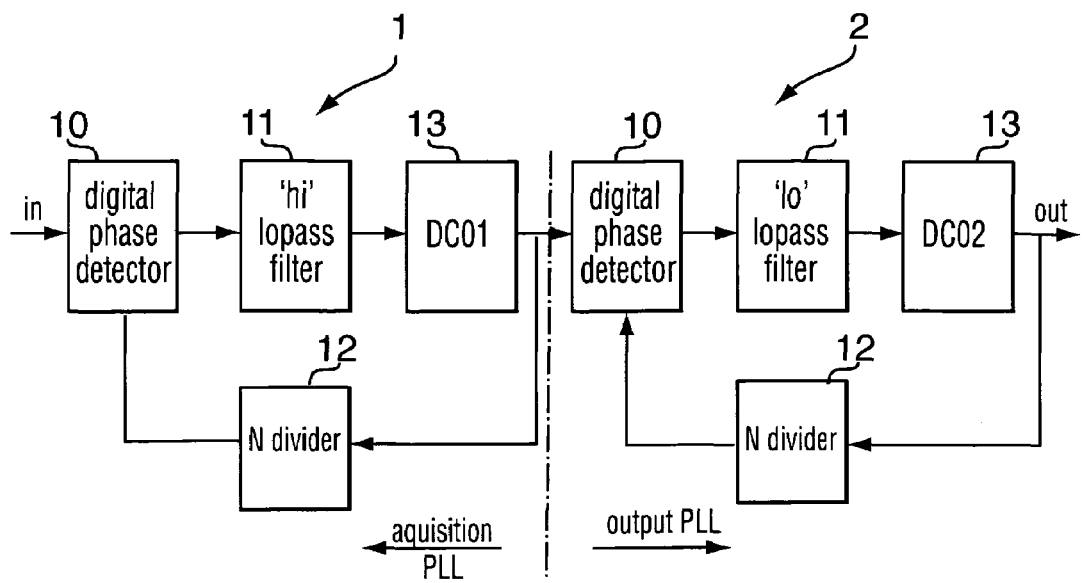
FIG. 6 shows a dual digital phase locked loop in accordance with the principles of the invention.

Referring now to FIG. 6, this has two all digital phase locked loops arranged in tandem, each having a digital phase detector 10, filter 11, digital controlled oscillator 13 and divider 12.

The first PLL 1 is referred toe as an acquisition PLL and has a low pass filter 11 with a relatively high cut-off frequency. For example, 300 KHz, so that the acquisition PLL tracks all changes in the input signal, including error components. The output of the first PLL 1 is connected to the input of a second PLL 2, forming an output PLL and generating an output signal.

The second PLL 2 has a low pass filter 11 with a relatively low cut-off frequency such that it does not track the error components in the output signal of the acquisition PLL.

By following the input signal very rapidly the system implicitly makes no errors in the phase detector; the phase detector is always accurately active around zero. Thus it is sufficient to look at the way that the DCO is driven to get all relevant information about the behaviour. There still is a reason to make the time quantization as fine as possible; if the time steps are small, the information can have more bits, and the coupling to the DCO 13 can be made with a smaller least significant bit. Thus a smaller timestep will implicitly make the limit cycle behavior of the system smaller. This is of interest for the detection of the smallest errors; if the limit cycle has a top-top behavior of for instance 1 ns, detection of errors around 10 ps is not trivial, although these numbers are relevant in current technologies.

A beneficial effect of the rapid input acquisition PLL is that this effectively also can be used to recover data, by generating the position of sampling in the eye diagram. For such a PLL it is essential that relatively high frequencies are followed such as noise, but not so high that ISI (Inter Symbol Interference) is also followed. ISI may give rise to quite severe shifts of the zero crossings in the input signal (relative to the 'ideal' clock that is), especially for directly neighboring symbols. Depending on the roll-off curves of the spectrum (0.13, 0.15, 0.25 etc) and the form of the spectrum (GMSK, RAised COSine, Feher etc.) the ISI may be larger or smaller, but typically the relevant part of ISI does not 'visibly' extend beyond 5 symbols. This suggest a PLL that has a relatively high low pass frequency, but does get rid of anomalies that arise on the scale of a few symbols. For higher frequencies such as Sonet (155 MHz) thus the use of a bandwidth around a few 100 kHz is attractive.

Since the rapid following PLLs can accurately determine the digitized phase of the input signal, they are referred to as acquisition PLLs. The actual bandwidth of the PLL is not critical, but the relative bandwidth of the PLL, related to the normal disturbances on the input signal, is important. It must be large enough to encompass all such normal disturbances.

The output generating PLL 2 makes use of the accurately quantized input signal. Even though the output PLL may be slow, so that it does not closely follow the input PLL, the quantization error does not turn up again as the input reference signal to the second PLL is already digital and no additional analog-to-digital conversion step is required.

It is possible to combine several acquisition PLLs in one system, so that switching over from one to another can be implemented. The switching from one input to another one can digitally be done smoothly. For telecomm applications this is critical; when switching there is a MTIE demand, which puts a maximum on the occurring phase error when a switch is made. This approach allows for a theoretical 0 error, for we switch from a fully characterized signal to another fully characterized signal. Traditionally maximum errors in the order from 1 ns up to 1 µs are demanded, which now becomes relatively trivial. Other solutions require first training after switching, which always implies all behavioral phase aspects of the input signal now become known. Thus it becomes possible to fully characterize the input signal for its phase behavior. This may be in the form of for instance a statistical set of numbers (such as minimum, maximum, average, standard deviation of frequency, phase over time) or a complete FFT dataset. Thus it becomes possible to have on line information of input signals, so that prediction of arising problems becomes better possible. Also it becomes possible to test for compliance with relevant standards, while operating normally.

The statistical measurements make it possible to characterize the implementation of the idea itself for its inherent limitations; by following a 'clean' signal, such as may be generated by a crystal, it becomes possible to have a characterization of the device itself. This is a critical element to make the device self testable. This self testability can be utilized both during production and in the application in the field.

It is possible to use several output PLL's, that may respond with different speeds. This in turn may be used to establish the difference of the two outputs in the band between the two speeds. Thus it becomes possible to perform a simple bandpass characterization, or frequency characterization, without FFT.

Mathematical operations on the digital outputs of a number of acquisition PLL's is trivial. This is true for any relevant piece of information; phase, frequency etc. Relatively obvious operations are; addition, averaging, weighted averaging. To give examples of such use; averaging is typically usable for generation of a clock which is the precise average of a number of clocks. This is utilized in central points of networks, where several atomic clocks are 'averaged' to yield an output. The weighted averaging is a more general form that can be used to implement such a function. The summation of phases or frequencies may be used for instance in radar applications, where many different types of signals through mixers give summations of frequency effects.

Another simple class of operations can be found in fixed additions, multiplications and divisions. Phases can be made that have some rational (as in mathematically rational) relation. An example is N/M multiplication. This is typically necessary in for instance telecomm again, for instance to relate E1 and T1 to each other. Examples of phase or frequency addition can be seen in standards for DECT, TETRA and alike (fixed frequency offset between reception and transmission signal).

A very low level consideration of multiple acquisition PLLs is that it becomes simple to track a first input signal plus a first reserve signal, which may be switched to at any moment, plus a third acquisition PLL to look at other input signals, to measure them (up front characterization) or start using them as a better backup frequency. In the latter case the first reserve signal acquisition PLL could be freed up.

A decimator can be added if desired to derive a wanted error signal for a low frequency changing output.

Figure 7:
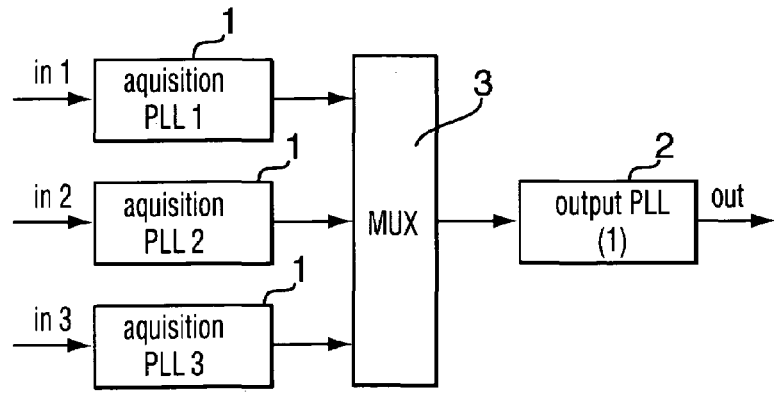
FIG. 7 shows a second embodiment of dual digital phase locked loop in accordance with the principles of the invention.

FIG. 7 shows a circuit with three acquisition PLLs 1 connected to the output PLL 2 through a Mux 3, which allows any one of the reference inputs to be selected.

Figure 8:
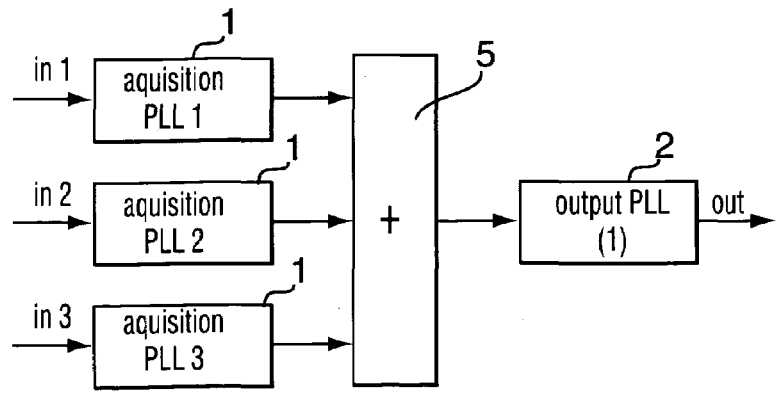
FIG. 8 shows a third embodiment dual digital phase locked loop in accordance with the principles of the invention.

FIG. 8 shows a similar circuit connected to the output PLL2. Several acquisition PLLs are connected to output PLL2 through a functional block 5 in the form of an equation operator, in this case an adder, that sums the reference inputs (with or without weighting factors) to yield the average frequency of several inputs.

Figure 9:
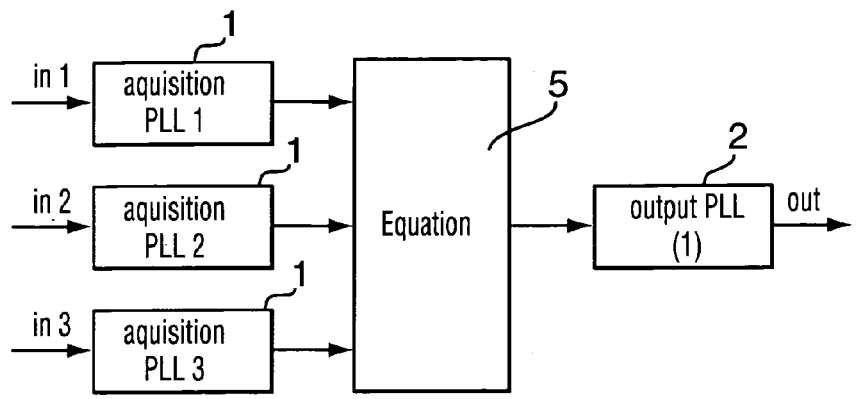
FIG. 9 shows a fourth embodiment dual digital phase locked loop in accordance with the principles of the invention.

FIG. 9 shows a more generalized model for three acquisition PLLs and one output PLL 2, where the output PLL receives some mathematical combination of the outputs of the acquisition PLLs1 through the functional block 5 in the form of an equation operator. The equation may encompass non-linear equations and also time dependent equations, normal linear equations etc. Of course the number of acquisition and output PLLs may be changed.

Figure 10:
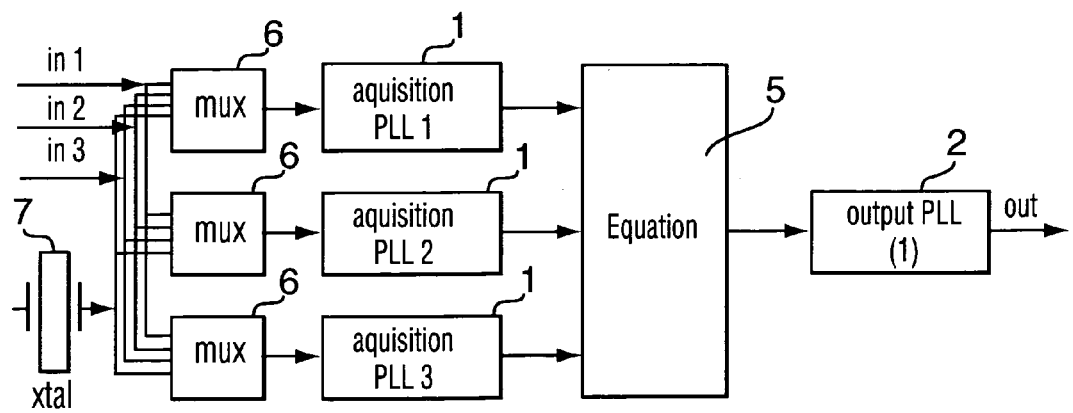
FIG. 10 shows a fifth embodiment dual digital phase locked loop in accordance with the principles of the invention.

FIG. 10 shows a plurality of acquisition PLLs 1 connected through functional block 5 in the form of an equation operator to output PLL 1. The acquisition PLLs 1 are connected through Muxes 6 to three inputs in 1, in 2, in 3 and crystal oscillator 7. This embodiment allows the quality of the circuits to be tested.

It will be clear that the number of possible and relevant implementations are enormous. The crucial element in this is that once the input is digitized, the operations can be handled error free, just by choosing the correct coding and the appropriate architecture. This opens up a wide range of applications, with negligible errors.

Although the present invention has been described and illustrated in detail, it is clearly understood that the same is by way of illustration and example only and is not to be taken by way of limitation, the spirit and scope of the invention being limited only by the terms of the appended claims.

What is claimed is:

1. A timing circuit for generating clock signals, comprising:
   a plurality of acquisition digital phase locked loops with a wide capture range for closely following respective input signals and their associated disturbances;
   a functional circuit deriving a digital output from the outputs of said acquisition phase locked loops according to a mathematical equation;
   an output digital phase locked loop having a slow response relative to said acquisition phase locked loop, said output digital phase locked loop tracking the digital output of said functional circuit to generate an output signal for the timing circuit; and
   wherein said acquisition digital phase locked loop and said output phase locked loop include digital low pass filters, said digital low pass filter in said acquisition digital phase locked loop having a higher cut-off frequency than said digital low pass filter in said output phase locked loop.

2. A timing circuit as claimed in claim 1, wherein said digital low pass filter in said acquisition digital phase locked loop has a cut-off frequency high enough to ensure that the output closely tracks the input signal and its associated error components.

3. A timing circuit as claimed in claim 2, wherein said digital low pass filter in said output digital phase locked loop has a cut-off frequency low enough to ensure that the output tracks the output of said acquisition digital phase locked loop signal without the associated error components present in the input signal.

4. A timing circuit as claimed in claim 1, wherein said functional circuit is an adder to combine the outputs of said acquisition digital phase locked loops to provide an average.

5. A timing circuit as claimed in claim 4, wherein said adder generates a weighted average.

6. A timing circuit as claimed in claim 1, wherein the inputs of said acquisition digital phase locked loops are connected through respective multiplexers to a plurality of inputs and a crystal oscillator.

7. A method of generating clock signals from input signals subject to errors, comprising:
   tracking the input signals and their error components with a plurality of acquisition digital phase locked loops to produce respective digital outputs;
   passing the digital outputs of said acquisition digital phase locked loops through a functional circuit which derives a digital output from the digital outputs of said acquisition phase locked loops according to a mathematical equation:
   tracking the digital output of said functional circuit with an output digital phase locked loop with a slow response relative to said acquisition digital phase locked loop so as to eliminate said error components; and
   wherein said acquisition digital phase locked loop has a digital filter with a high cut off frequency relative to the cut-off frequency of a digital filter in said output digital phase locked loop.

8. A method as claimed in claim 7, wherein said functional circuit combines said digital outputs of said acquisition digital phase locked loops to produce an average.

9. A method as claimed in claim 8, wherein said average is a weighted average.

10. A method as claimed in claim 7, wherein one of a plurality of input signals are selectable for input to each of said acquisition phase locked loops.

11. A method as claimed in claim 10, wherein one of said input signals is derived from a crystal oscillator for test purposes.

12. A method as claimed in claim 7, wherein said filter in said acquisition phase locked loop has a cut-off frequency of a few hundred Hertz.

* * * * *